US012801131B2

(12) United States Patent
Ylä-Jarkko et al.

(10) Patent No.: US 12,801,131 B2
(45) Date of Patent: Nov. 17, 2026

(54) MONITORING AND CONTROL OF A SEMICONDUCTOR MANUFACTURING PROCESS

(71) Applicant: Elisa Oyj, Helsinki (FI)

(72) Inventors: Kalle Ylä-Jarkko, Helsinki (FI); Rasmus Heikkilä, Helsinki (FI); Antti Liski, Helsinki (FI); Eero Hiltunen, Helsinki (FI); Jukka-Pekka Salmenkaita, Helsinki (FI)

(73) Assignee: Elisa Oyj, Helsinki (FI)

( * ) Notice: Subject to any disclaimer, the term of this patent is extended or adjusted under 35 U.S.C. 154(b) by 445 days.

(21) Appl. No.: 18/569,609

(22) PCT Filed: Jun. 6, 2022

(86) PCT No.: PCT/FI2022/050389
§ 371 (c)(1),
(2) Date: Dec. 13, 2023

(87) PCT Pub. No.: WO2022/263713
PCT Pub. Date: Dec. 22, 2022

(65) Prior Publication Data
US 2024/0219899 A1 Jul. 4, 2024

(30) Foreign Application Priority Data
Jun. 15, 2021 (FI) ..................................... 20215699

(51) Int. Cl.
*G05B 23/02* (2006.01)
*H10P 74/20* (2026.01)

(52) U.S. Cl.
CPC ....... *G05B 23/0275* (2013.01); *G05B 23/024* (2013.01); *G05B 23/0254* (2013.01); *H10P 74/203* (2026.01)

(58) Field of Classification Search
CPC .............. G05B 23/0275; G05B 23/024; G05B 23/0254; H10P 74/203
See application file for complete search history.

(56) References Cited

U.S. PATENT DOCUMENTS

2016/0371423 A1 12/2016 Vukkadala et al.
2017/0038201 A1 2/2017 Bozdog et al.
(Continued)

OTHER PUBLICATIONS

Gau et al., "Critical dimension error analysis for 0.13 Î1/4m photolithography and beyond" J. Vac. Sci. Technol. B 19, 2884-2889 (Year: 2001).*
(Continued)

*Primary Examiner* — John C Kuan
(74) *Attorney, Agent, or Firm* — Espatent Oy

(57) ABSTRACT

Monitoring of a semiconductor manufacturing process. Wafer measurement data is obtained (301); Zernike polynomials are fitted (302) to the wafer measurement data to obtain representation of respective wafermap patterns; a knowledgebase of wafermap patterns is built (303) based on the respective coefficients of the Zernike polynomials; the wafermap patterns of the knowledgebase are grouped (304) to wafermap pattern groups based on the respective coefficients of the Zernike polynomials; and at least some of the wafermap pattern groups of the knowledgebase and the respective coefficients of the Zernike polynomials are used (305) for analyzing new wafer measurement data for the purpose of monitoring the semiconductor manufacturing process.

20 Claims, 2 Drawing Sheets

(56) References Cited

U.S. PATENT DOCUMENTS

| | | | |
|---|---|---|---|
| 2017/0242425 A1 | 8/2017 | Buhl et al. | |
| 2018/0005370 A1 | 1/2018 | Kitada et al. | |
| 2018/0330493 A1 | 11/2018 | Milligan | |
| 2019/0096659 A1 | 3/2019 | Xu et al. | |
| 2020/0135592 A1* | 4/2020 | Fonseca | H10P 74/203 |
| 2021/0166365 A1 | 6/2021 | Inoue et al. | |

OTHER PUBLICATIONS

Padonou, E. et al. Spatial risk assessment on circular domains: Application to wafer profile monitoring, 2015 IEEE, downloaded on Jan. 18, 2022 from IEEE Xplore.

Chastan, M. et al. Unsupervised density-based machine learning for abnormal leveling signatures detection, Proc. SPIE 11611, Metrology, Inspection, and Process Control for Semiconductor Manufacturing XXXV, 116111N (Feb. 22, 2021); doi: 10.1117/12.2581468.

Wikipedia, Knowledge base, Retrieved from "https://en.wikipedia.org/w/index.php?title=Knowledge_base&oldid=1024732951" submitted 2023.

Zernike analysis of all-sky night brightness maps, Article in Applied Optics . Apr. 2014 DOI: 10.1364/AO.53.002677 • Source: PubMed.

Kouta Nakata et al. A Comprehensive Big-Data-Based Monitoring System for Yield Enhancement in Semiconductor Manufacturing, IEEE Transactions on Semiconductor Manufacturing, vol. 30, No. 4, Nov. 2017.

Chien, Jong-Chih et al. Inspection and Classification of Semiconductor Wafer Surface Defects Using CNN Deep Learning Networks, in Applied Sciences, Published: Aug. 2, 2020.

Schrunner, Stefan et al. Machine Learning Based Indicators to Enhance Process Monitoring by Pattern Recognition, Mar. 25, 2021.

Padonou, Esperan. Statistical Learning on Circular Domains For Advanced Process Control in Microelectronics. Other. Université de Lyon, 2016. English. ffNNT : 2016LYSEM009ff. fftel-01438684v2ff.

Schrunner, Stefan. Pattern Recognition in Analog Wafer Test Data. A Health Factor for Process Patterns. Doctoral Thesis, Graz University of Technology, Institute of Interactive Systems and Data Science, Faculty of Computer Science and Biomedical Engineering. Graz, Aug. 2019.

Zernike polynomials: A guide. Article in Journal of Modern Optics • Apr. 2011, DOI: 10.1080/09500340.2011.633763.

* cited by examiner

MONITORING AND CONTROL OF A SEMICONDUCTOR MANUFACTURING PROCESS

TECHNICAL FIELD

The present application generally relates to monitoring and control of a complex process, such as semiconductor manufacturing process.

BACKGROUND

This section illustrates useful background information without admission of any technique described herein representative of the state of the art.

Semiconductor manufacturing process is a complex process comprising plurality of production steps and associated parameters. Quality of end product is dependent on accuracy and quality of each production step. Therefore quality monitoring and control of the process is important.

In general, a semiconductor wafer is built layer by layer in a cyclic process where the same or similar sequence of manufacturing steps is repeated to generate a 3D structure. There may be for example 100-400 manufacturing steps. Quality of wafers is monitored for example based on measurements performed at a plurality of discrete measurement sites on the wafer surface of the final product. The amount of available measurement data is huge. Therefore, automated data processing is clearly beneficial in this context.

Now a new approach is provided for monitoring and control of a semiconductor manufacturing process.

SUMMARY

The appended claims define the scope of protection. Any examples and technical descriptions of apparatuses, products and/or methods in the description and/or drawings not covered by the claims are presented not as embodiments of the invention but as background art or examples useful for understanding the invention.

According to a first example aspect there is provided a computer implemented method for monitoring of a semiconductor manufacturing process. The method comprises

- obtaining wafer measurement data of a plurality of wafers;
- fitting Zernike polynomials to the wafer measurement data to obtain representation of respective wafermap patterns;
- building a knowledgebase of wafermap patterns based on the respective coefficients of the Zernike polynomials;
- grouping the wafermap patterns of the knowledgebase to wafermap pattern groups based on the respective coefficients of the Zernike polynomials; and
- using at least some of the wafermap pattern groups of the knowledgebase and the respective coefficients of the Zernike polynomials to analyse new wafer measurement data for the purpose of monitoring the semiconductor manufacturing process.

According to a second example aspect there is provided another computer implemented method for monitoring of a semiconductor manufacturing process. The method comprises

- obtaining wafer measurement data of a known group of wafers;
- fitting Zernike polynomials to the wafer measurement data to obtain representation of respective wafermap patterns;

- including wafermap patterns of the known group of wafers and the respective coefficients of the Zernike polynomials in a knowledgebase of wafermap patterns; and
- using at least some of the wafermap pattern groups of the knowledgebase and the respective coefficients of the Zernike polynomials to analyse new wafer measurement data for the purpose of monitoring the semiconductor manufacturing process.

The wafer measurement data of known group of wafers may be data obtained from measurements of wafers with known properties or from synthetically generated data.

In some embodiments, the grouping of the wafermap patterns comprises placing similar wafermap pattern groups to same group.

In some embodiments, the method further comprises identifying at least one of the wafermap pattern groups as wafermap patterns of normal operating condition; and identifying at least one of the wafermap pattern groups as wafermap patterns of abnormal operating condition.

In some embodiments, more than one of the wafermap pattern groups are identified as wafermap patterns of different abnormal operating conditions.

In some embodiments, the analysis of the new wafer measurement data comprises comparing coefficients of Zernike polynomials of the new wafer measurement data to the coefficients of Zernike polynomials of the knowledgebase.

In some embodiments, the analysis of the new wafer measurement data comprises that the new wafer measurement data is classified as belonging to one of the wafermap pattern groups of the knowledgebase or identified to be an outlier.

In some embodiments, the analysis of the new wafer measurement data comprises detection of anomalies in the new wafer measurement data.

In some embodiments, the coefficients of the Zernike polynomials are accompanied with further features associated with the wafer measurement data and the further features are used as (further) grouping parameters in grouping the wafermap patterns of the knowledgebase.

In some embodiments, the method comprises identifying at least one of the wafermap pattern groups as wafermap patterns of normal operating condition; and using the wafermap patterns of normal operating condition to analyse the new wafer measurement data.

In some embodiments, the method comprises using the wafermap pattern groups of the knowledgebase and the respective coefficients of the Zernike polynomials to train a machine learning model to analyse the new wafer measurement data.

In some embodiments, the method comprises using the trained machine learning model to analyse new wafer measurement data and to determine anomaly score(s) for the new wafer measurement data; and providing the anomaly score(s) to statistical process control.

In some embodiments, the method comprises using results from the analysis of the new wafer measurement data to control the semiconductor manufacturing process.

In some embodiments, the method comprises using results from the analysis of the new wafer measurement data to perform at least one of: yield estimation, root cause analysis, equipment matching, determining advice for alignment between layers of the wafer, determining adjustments to the semiconductor manufacturing process.

In some embodiments, the analysis of the new wafer measurement data comprises determining similarity metric between the new wafer measurement data and wafermap pattern groups of the knowledgebase based on the coefficients of the Zernike polynomials.

In some embodiments, the analysis of the new wafer measurement data comprises classifying the new wafer measurement data to wafermap pattern groups of the knowledgebase. Additionally of alternatively, the new wafer measurement data may be identified to be an outlier. Additionally of alternatively, the analysis may comprise updating the knowledgebase based on the new measurement data. Additionally of alternatively, the analysis may comprise identifying new wafermap pattern groups.

In some embodiments, the analysis of the new wafer measurement data comprises detecting drift in the semiconductor manufacturing process. Additionally of alternatively, the analysis may comprise detecting changes in densities of wafermap patterns in a feature space of the knowledgebase. Additionally or alternatively, the analysis may comprise detecting changes in densities of wafermap pattern groups of the knowledgebase.

In some embodiments, the wafer measurement data comprises measurements from a plurality of wafers from manufacturing phases of different layers of the wafer. Additionally of alternatively, the wafer measurement data may comprise measurements from a plurality of wafers from different manufacturing equipment.

In some embodiments, the wafer measurement data comprises parameter values related to at least one of: surface height variation of respective wafers, thickness of respective wafers, and/or thickness of a layer of respective wafers.

According to a third example aspect of the present invention, there is provided an apparatus comprising a processor and a memory including computer program code; the memory and the computer program code configured to, with the processor, cause the apparatus to perform the method of the first or second aspect or any related embodiment.

According to a fourth example aspect of the present invention, there is provided a computer program comprising computer executable program code which when executed by a processor causes an apparatus to perform the method of the first or second aspect or any related embodiment.

According to a fifth example aspect there is provided a computer program product comprising a non-transitory computer readable medium having the computer program of the fourth example aspect stored thereon.

According to a sixth example aspect there is provided an apparatus comprising means for performing the method of the first or second aspect or any related embodiment.

Any foregoing memory medium may comprise a digital data storage such as a data disc or diskette, optical storage, magnetic storage, holographic storage, opto-magnetic storage, phase-change memory, resistive random access memory, magnetic random access memory, solid-electrolyte memory, ferroelectric random access memory, organic memory or polymer memory. The memory medium may be formed into a device without other substantial functions than storing memory or it may be formed as part of a device with other functions, including but not limited to a memory of a computer, a chip set, and a sub assembly of an electronic device.

Different non-binding example aspects and embodiments have been illustrated in the foregoing. The embodiments in the foregoing are used merely to explain selected aspects or steps that may be utilized in different implementations. Some embodiments may be presented only with reference to certain example aspects. It should be appreciated that corresponding embodiments may apply to other example aspects as well.

BRIEF DESCRIPTION OF THE FIGURES

Some example embodiments will be described with reference to the accompanying figures, in which.

DETAILED DESCRIPTION

Figure 1:
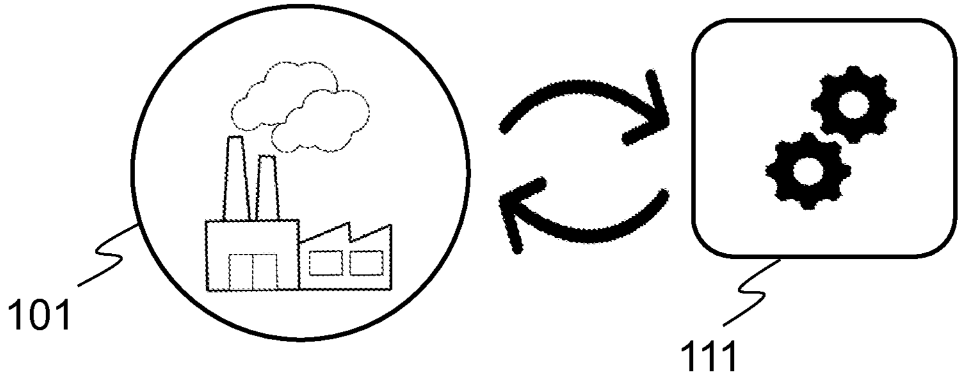
FIG. 1 schematically shows an example scenario according to an example embodiment.

In the following description, like reference signs denote like elements or steps. FIG. 1 shows an example scenario according to an embodiment. The scenario shows a semiconductor manufacturing process 101 and an automation system 111 configured to obtain data from the semiconductor manufacturing process in order to monitor and control the semiconductor manufacturing process. The automation system 111 is configured to implement at least some example embodiments of present disclosure. Output from the automation system 111 may be used as a basis for deciding on changes in the semiconductor manufacturing process. The changes may be decided by quality control personnel or the process may be automatic at least to some extent.

Figure 2:
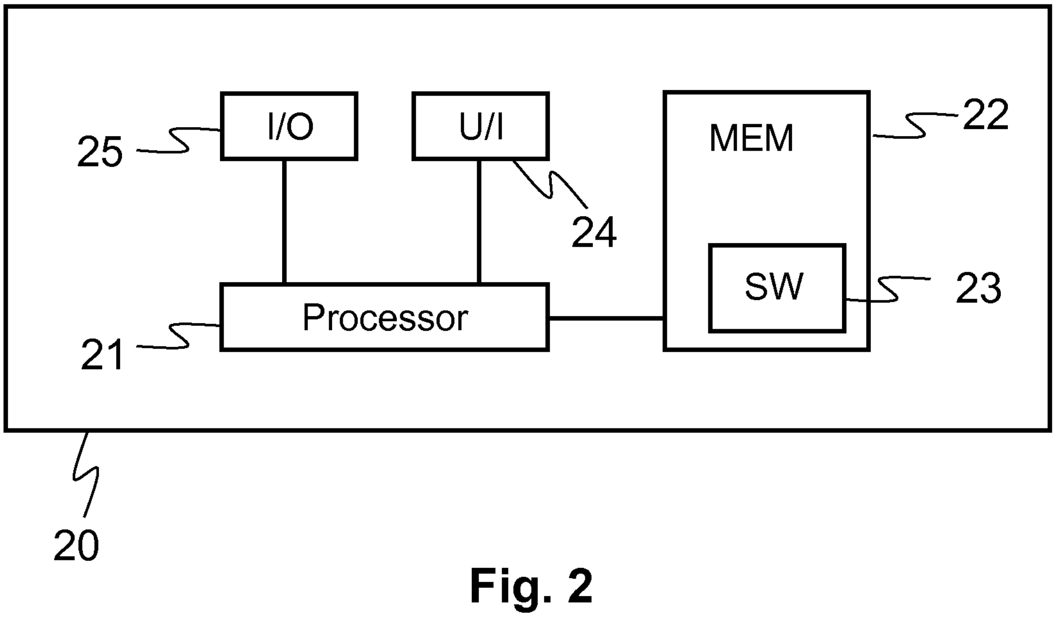
FIG. 2 shows a block diagram of an apparatus according to an example embodiment.

FIG. 2 shows a block diagram of an apparatus 20 according to an embodiment. The apparatus 20 is for example a general-purpose computer or server or some other electronic data processing apparatus. The apparatus 20 can be used for implementing at least some embodiments of the invention. That is, with suitable configuration the apparatus 20 is suited for operating for example as the automation system 111 of foregoing disclosure.

The apparatus 20 comprises a communication interface 25; a processor 21; a user interface 24; and a memory 22. The apparatus 20 further comprises software 23 stored in the memory 22 and operable to be loaded into and executed in the processor 21. The software 23 may comprise one or more software modules and can be in the form of a computer program product.

The processor 21 may comprise a central processing unit (CPU), a microprocessor, a digital signal processor (DSP), a graphics processing unit, or the like. FIG. 2 shows one processor 21, but the apparatus 20 may comprise a plurality of processors.

The user interface 24 is configured for providing interaction with a user of the apparatus. Additionally or alternatively, the user interaction may be implemented through the communication interface 25. The user interface 24 may comprise a circuitry for receiving input from a user of the apparatus 20, e.g., via a keyboard, graphical user interface shown on the display of the apparatus 20, speech recognition circuitry, or an accessory device, such as a headset, and for providing output to the user via, e.g., a graphical user interface or a loudspeaker.

The memory 22 may comprise for example a non-volatile or a volatile memory, such as a read-only memory (ROM), a programmable read-only memory (PROM), erasable programmable read-only memory (EPROM), a random-access memory (RAM), a flash memory, a data disk, an optical storage, a magnetic storage, a smart card, or the like. The apparatus 20 may comprise a plurality of memories. The memory 22 may serve the sole purpose of storing data, or be constructed as a part of an apparatus 20 serving other purposes, such as processing data.

The communication interface 25 may comprise communication modules that implement data transmission to and from the apparatus 20. The communication modules may comprise a wireless or a wired interface module(s) or both. The wireless interface may comprise such as a WLAN, Bluetooth, infrared (IR), radio frequency identification (RF ID), GSM/GPRS, CDMA, WCDMA, LTE (Long Term Evolution) or 5G radio module. The wired interface may comprise such as Ethernet or universal serial bus (USB), for example. The communication interface 25 may support one or more different communication technologies. The apparatus 20 may additionally or alternatively comprise more than one of the communication interfaces 25.

A skilled person appreciates that in addition to the elements shown in FIG. 2, the apparatus 20 may comprise other elements, such as displays, as well as additional circuitry such as memory chips, application-specific integrated circuits (ASIC), other processing circuitry for specific purposes and the like. Further, it is noted that only one apparatus is shown in FIG. 2, but the embodiments of the invention may equally be implemented in a cluster of shown apparatuses.

Figure 3:
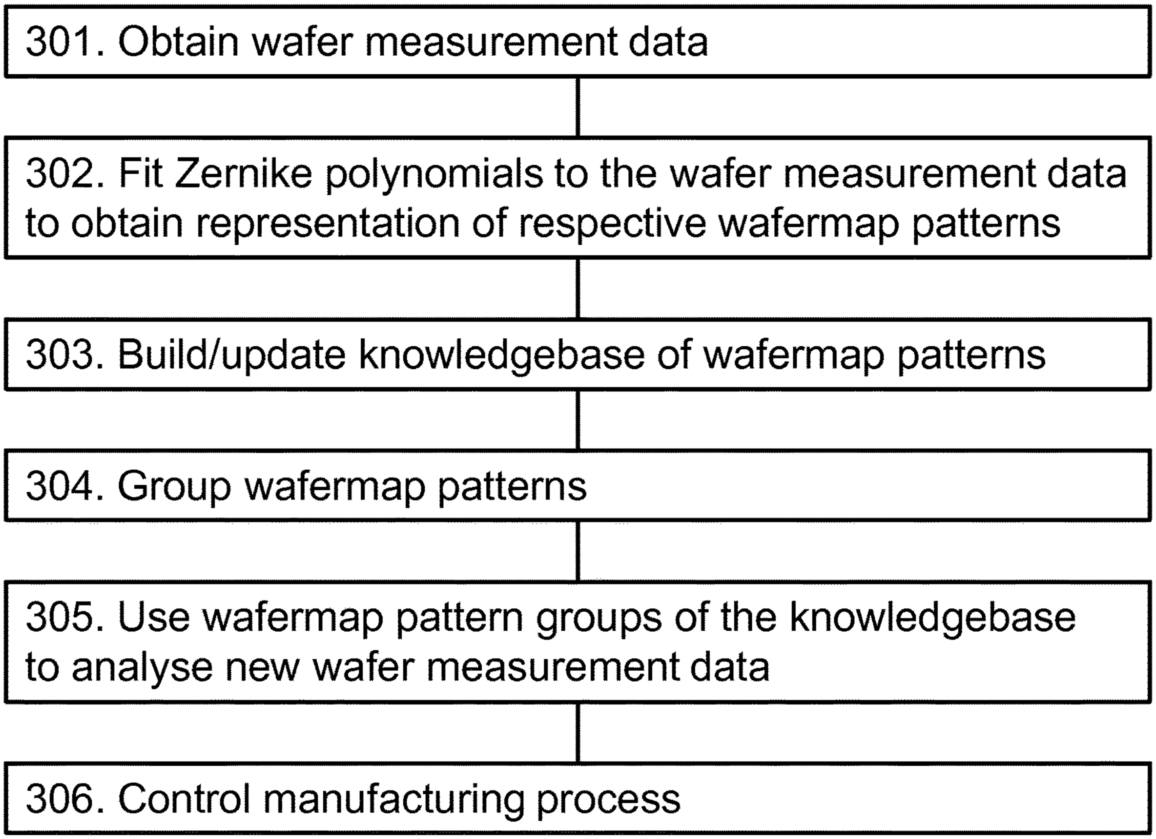
FIGS. 3 and 4 show flow diagrams illustrating example methods according to certain embodiments.
Figure 4:
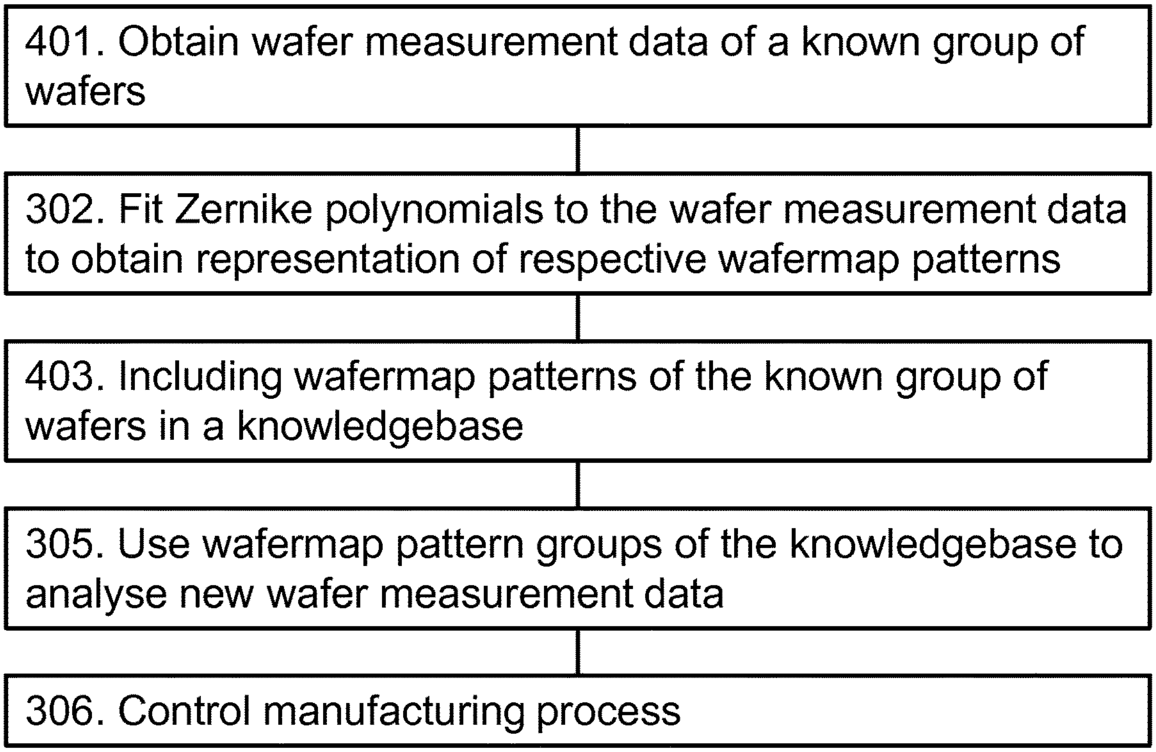

FIGS. 3 and 4 show flow diagrams illustrating example methods according to certain embodiments. The methods may be implemented in the automation system 111 of FIG. 1 and/or in the apparatus 20 of FIG. 2. The methods are implemented in a computer and do not require human interaction unless otherwise expressly stated. It is to be noted that the methods may however provide output that may be further processed by humans and/or the methods may require user input to start. Different phases shown in the flow diagrams may be combined with each other and the order of phases may be changed except where otherwise explicitly defined. Furthermore, it is to be noted that performing all phases of the flow diagram is not mandatory.

The method of FIG. 3 relates to monitoring of a semiconductor manufacturing process and comprises the following phases:

301: Wafer measurement data of a plurality of wafers is obtained.

In general, wafer measurement data comprises measurements performed at a plurality of discrete measurement sites on the wafer surface and coordinates of respective measurement sites. Usually, the measurements sites cannot be freely distributed since possible measurement locations depend on the wafer type that is produced. E.g. components manufactured on the wafer may restrict the locations of the measurement sites. Hence, the measurement sites cannot be uniformly distributed over the surface area of the wafer and at this stage the measurement data is spatially dependent.

The wafer measurement data comprises for example parameter values related to at least one of: surface height variation of the wafer, thickness of the wafer, and/or thickness of a layer of the wafer. The wafer measurement data may provide absolute values or the wafer measurement data may provide value of a variable that correlates with surface height or thickness. For example a suitable electric variable that correlates with surface height or thickness can be used.

The wafer measurement data may comprise measurements from single manufacturing phase or from a plurality of manufacturing phases. Additionally or alternatively, the wafer measurement data may comprise measurements from manufacturing phases of different layers of the wafer and/or measurements from different manufacturing equipment.

302: Zernike polynomials are fitted to the wafer measurement data to obtain representation of respective wafermap patterns. In this way features of the patterns are constructed.

Zernike polynomials are a sequence of orthogonal functions. The wafer measurement data is transformed into latent variable space formed by coefficients of Zernike polynomials. A benefit of using Zernike polynomials is that Zernike polynomials are not sensitive to measurement site locations or missing points. In this way, spatially independent data is generated.

Use of Zernike polynomials is discussed in more detail for example in Esperan Padanou, "Statistical Learning on Circular Domains For Advanced Process Control in Microelectronics", Universite'e de Lyon, 2016, tel-01438684.

303: A knowledgebase of wafermap patterns is built (or later updated) based on respective coefficients of the Zernike polynomials.

The knowledgebase thereby achieved comprises a robust representation of wafermap patterns that appear in the semiconductor manufacturing process that is being monitored.

304: The wafermap patterns of the knowledgebase are grouped to wafermap pattern groups based on the respective coefficients of the Zernike polynomials.

In an embodiment, the grouping of the wafermap patterns employs further features associated with the wafer measurement data in addition to the coefficients of the Zernike polynomials. For example standard deviation, mean or the like derived from the wafer measurement data could be used and/or data from a statistical process control framework could be used. The coefficients of the Zernike polynomials may be accompanied with the further features and the further features may then be used as additional grouping parameters for grouping the wafermap patterns of the knowledgebase.

In general, the grouping is performed by placing similar wafermap pattern groups to same group. In this way, a plurality of different groups are formed and each group comprises similar wafermap patterns.

For example one of the following methods can be employed for grouping (or clustering) the wafermap patterns of the knowledgebase: K-means, divisive hierarchical clustering (top-down), aggregative hierarchical clustering (bottom-up), density-based clustering methods, similarity matrix.

In an embodiment, the wafermap pattern groups of the knowledgebase are classified so that at least one of the wafermap pattern groups is identified to represent normal operating condition. Additionally, at least one of the wafermap pattern groups may be identified to represent abnormal operating condition. Further, more than one of the wafermap pattern groups may be identified to represent abnormal operating condition. Abnormal operating conditions refer to undesired results or error situations. By having plurality of groups of abnormal operating conditions, one achieves that it is possible to gain understanding of how common certain types of abnormal situations are. Further there may be some outlier wafermap patterns that do not belong to any of the groups or there could be a mixed group comprising normal and abnormal wafermap patterns. Classification of the wafermap pattern groups may be based on expert knowledge e.g. from statistical process control framework. Automatic classification of the wafermap pattern groups may be performed for example as follows: biggest group is classified as normal (i.e. representing normal operating condition) and other, smaller groups are classified as abnormal (i.e. representing abnormal operating condition). Additionally or alternatively, it may be required that the smaller groups are sufficiently distant or distinct from the biggest group in order to classify them as abnormal.

Resulting groups or clusters may have arbitrary shapes, different sizes and different densities.

305: At least some of the wafermap pattern groups of the knowledgebase and respective Zernike polynomials are used to analyse new wafer measurement data for the purpose of monitoring the semiconductor manufacturing process. Herein new wafer measurement data refers to measurement data that has not yet been used for building or updating the knowledgebase.

The analysis of the new wafer measurement data is performed by comparing coefficients of Zernike polynomials of the new wafer measurement data to the coefficients of Zernike polynomials of the knowledgebase.

Based on the wafermap pattern groups of the knowledgebase and respective Zernike polynomials the new wafer measurement data may be classified as belonging to one of the wafermap pattern groups of the knowledgebase or the new wafer measurement data may be identified to be an outlier (an isolated deviation from identified groups). Further, the new wafer measurement data may be used for updating the knowledgebase with wafermap patterns (the coefficients of the respective Zernike polynomials) of the new measurement data. In this way, the semiconductor manufacturing process is being monitored and anomalies in the new measurement data may be detected.

In some embodiments, wafermap patterns of normal operating condition are used to analyse new wafer measurement data, although wafermap patterns of abnormal operating condition may be used, too.

In some embodiments, the wafermap pattern groups of the knowledgebase and respective coefficients of the Zernike polynomials are used to train a machine learning model to analyse the new wafer measurement data and to detect anomalies in the new wafer measurement data.

The trained machine learning model can be used to analyse new wafer measurement data and to determine anomaly score for the new wafer measurement data. The anomaly score(s) thereby obtained can be provided to statistical process control.

In some embodiments, the analysis of the new wafer measurement data is performed by determining similarity metric between the new wafer measurement data and wafermap pattern groups of the knowledgebase based on the coefficients of the Zernike polynomials. Zernike polynomial coefficients corresponding to the new wafer measurement data are compared to the Zernike polynomial coefficients in the knowledgebase and based on this comparison, the new wafer measurement data is classified into one of the wafer pattern groups of the knowledgebase. The similarity metric may be related to distance or difference between the new wafer measurement data and wafermap pattern groups of the knowledgebase.

Over time, changes in feature space of the knowledgebase may be identified as analysis of new wafer measurement data is continued and analysed data is being accumulated. For example, new wafer pattern groups may be identified, changes in sizes of the wafer pattern groups may be identified, changes in balance between the wafer pattern groups may be identified. All of these may be an indication of something that should receive attention from quality control.

Analysis of the new wafer measurement data may result in detecting drift (gradual change from certain operating conditions to new operating conditions) in the semiconductor manufacturing process or detecting changes in densities of wafermap patterns in a feature space of the knowledgebase. As analysis of new wafer measurement data is continued and analysed data is being accumulated, changes in feature space and wafermap pattern groups of the knowledgebase may be identified.

The results from the analysis of the new wafer measurement data can be used to perform at least one of: yield estimation, root cause analysis, equipment matching, determining advice for alignment between layers of the wafer, determining adjustments to the semiconductor manufacturing process.

306: Results from the analysis of the new wafer measurement data can be used to control the semiconductor manufacturing process either manually or automatically.

For example, anomalies detected in the new wafer measurement data (i.e. anomalous wafers) can be exclude from production flow. Further, actions may be taken to solve the root cause of the detected anomalies in order to avoid the anomalous wafers in future. It is to be noted that there may be a different process for identifying the root cause and for deciding on the actions to be taken. That is, the results of the monitoring and anomaly detection process of the present disclosure may be used as source information for root cause analysis and/or for process control.

The method of FIG. 4 relates to monitoring of a semiconductor manufacturing process, wherein a group of wafers with known properties is used. There may be for example a group of wafers with a known defect or there may be a group of wafers with optimal or near optimal properties. The method comprises the following phases:

401: Wafer measurement data of a known group of wafers is obtained. The wafer measurement data corresponds to the wafer measurement data discussed in connection with phase 301 of FIG. 3. The difference is that the wafers belong to a known group of wafers with known properties. It may be known that the wafers represent normal operating condition or that the wafers represent abnormal operating condition. This knowledge may be obtained from experts or from statistical process control framework.

The wafer measurement data of this example may be obtained from measurements of wafers with known properties or the wafer measurement data may be synthetic in the sense that the wafer measurement data is not obtained from an existing wafer but simulated data or artificially generated data by an expert with suitable electronic tools. In this way, the expert is able to control the data that is used for building the knowledgebase and may thereby guide the knowledgebase to certain direction.

302: Zernike polynomials are fitted to the wafer measurement data of the known group of wafers to obtain representation of respective wafermap patterns. In this way features of the patterns are constructed. This phase is basically similar to the corresponding phase in FIG. 3.

403: Wafermap patterns of the known group of wafers and respective coefficients of the Zernike polynomials are included in a knowledgebase of wafermap patterns.

The group of wafers with known properties can be used for building the knowledgebase of wafermap patterns or for updating previously built knowledgebase. In this way, the method of FIG. 4 can be used in combination with the method of FIG. 3. Alternatively, the method of FIG. 4 can be used independently without the use of the method of FIG. 3. As the process starts with an identified group of wafers, there is no need for grouping and classification of groups in the method of FIG. 4.

The knowledgebase thereby obtained is usable for analysing new wafer measurement data the same way as in phases 305 and 306 of FIG. 3.

One may define that in the method of FIG. 3, the groups of wafermap patterns are naturally formed based on measured wafers, whereas in the method of FIG. 4 the groups of wafermap patterns are purposefully formed based on wafers with known properties or based on synthetically generated data.

Without any limiting effect, a technical effect of one or more of the example embodiments disclosed herein is improved semiconductor manufacturing control.

Another technical effect of one or more of the example embodiments disclosed herein is that a widely applicable knowledgebase of wafermap patterns is provided. The knowledgebase that is based on (the coefficients of) the Zernike polynomials provides that the wafer measurement data that is analysed using the knowledgebase may have varying number of measurement sites and the coordinates of the measurements sites may vary, too. In this way, the same knowledgebase can be used for monitoring different manufacturing phases, different manufacturing equipment, and different products. Further, the wafer pattern knowledgebase of various embodiments provides for example detecting drift and/or changes in wafer pattern densities. These can be an indication of changes that may cause adverse effects in the manufacturing process and thus need attention. Still further, by having plurality of different wafermap pattern groups of different abnormal operating conditions in the knowledgebase, one achieves that it is possible to gain understanding of how common certain types of abnormal situations are in the semiconductor manufacturing process. This enables focusing on the most frequently occurring errors, whilst rare error situations can be ignored or given less attention.

Another technical effect of one or more of the example embodiments disclosed herein is that a machine learning model for detecting anomalies can be generated based on relatively small amount of measurement data. This is because just a few Zernike polynomials are often enough to represent the surface of the wafer. For example, measurement data from 100-500 wafers may suffice in the beginning in embodiments of the present disclosure, whereas for example deep learning models may require measurement data from over 20000 wafers for the training phase. In embodiments disclosed herein, the knowledgebase is continuously updated and expanded when new data measurement data is being analyzed.

If desired, the different functions discussed herein may be performed in a different order and/or concurrently with each other. Furthermore, if desired, one or more of the before-described functions may be optional or may be combined Various embodiments have been presented. It should be appreciated that in this document, words comprise, include and contain are each used as open-ended expressions with no intended exclusivity.

The foregoing description has provided by way of non-limiting examples of particular implementations and embodiments a full and informative description of the best mode presently contemplated by the inventors for carrying out the invention. It is however clear to a person skilled in the art that the invention is not restricted to details of the embodiments presented in the foregoing, but that it can be implemented in other embodiments using equivalent means or in different combinations of embodiments without deviating from the characteristics of the invention.

Furthermore, some of the features of the afore-disclosed example embodiments may be used to advantage without the corresponding use of other features. As such, the foregoing description shall be considered as merely illustrative of the principles of the present invention, and not in limitation thereof. Hence, the scope of the invention is only restricted by the appended patent claims.

The invention claimed is:

1. A computer implemented method for monitoring of a semiconductor manufacturing process, the method comprising:

obtaining wafer measurement data of a plurality of wafers, wherein the wafer measurement data comprises at least one of: surface height variation of a wafer, thickness of the wafer, thickness of a layer of the wafer;

fitting Zernike polynomials to the wafer measurement data to obtain representation of respective wafermap patterns;

building a knowledgebase of wafermap patterns based on respective coefficients of the Zernike polynomials;

grouping the wafermap patterns of the knowledgebase to a plurality of wafermap pattern groups based on the respective coefficients of the Zernike polynomials;

using at least some of the wafermap pattern groups of the knowledgebase and the respective coefficients of the Zernike polynomials to analyse new wafer measurement data for the purpose of monitoring the semiconductor manufacturing process; and detecting an anomaly in the new wafer measurement data based on said analysing; and in response to detecting the anomaly, automatically controlling the semiconductor manufacturing process by excluding from a production flow at least one wafer associated with the new wafer measurement data.

2. The method of claim 1, wherein the grouping comprises placing similar wafermap pattern groups to a same group.

3. The method of claim 1, further comprising identifying at least one of the wafermap pattern groups as wafermap patterns of normal operating condition; and identifying at least one of the wafermap pattern groups as wafermap patterns of abnormal operating condition.

4. The method of claim 3, further comprising identifying more than one of the wafermap pattern groups as wafermap patterns of different abnormal operating conditions.

5. The method of claim 1, wherein analysis of the new wafer measurement data comprises comparing coefficients of Zernike polynomials of the new wafer measurement data to the coefficients of Zernike polynomials of the knowledgebase.

6. The method of claim 1, wherein analysis of the new wafer measurement data comprises that the new wafer measurement data is classified as belonging to one of the wafermap pattern groups of the knowledgebase or identified to be an outlier.

7. The method of claim 1, wherein analysis of the new wafer measurement data comprises detection of anomalies in the new wafer measurement data.

8. The method of claim 1, further comprising using the wafermap pattern groups of the knowledgebase and the respective coefficients of the Zernike polynomials to train a machine learning model to analyse the new wafer measurement data.

9. The method of claim 8, further comprising using the trained machine learning model to analyse the new wafer measurement data and to determine anomaly score(s) for the new wafer measurement data; and providing the anomaly score(s) to statistical process control.

10. The method of claim 1, further comprising using results from the analysis of the new wafer measurement data to control (306) the semiconductor manufacturing process.

11. The method of claim 1, further comprising using results from the analysis of the new wafer measurement data to perform at least one of: yield estimation, root cause analysis, equipment matching, determining advice for alignment between layers of the wafer, determining adjustments to the semiconductor manufacturing process.

12. The method of claim 1, wherein the analysis of the new wafer measurement data comprises determining similarity metric between the new wafer measurement data and wafermap pattern groups of the knowledgebase based on the coefficients of the Zernike polynomials.

13. The method of claim 1, wherein the analysis of the new wafer measurement data comprises updating the knowledgebase based on the new measurement data.

14. The method of claim 1, wherein the analysis of the new wafer measurement data comprises identifying new wafermap pattern groups.

15. The method of claim 1, wherein the analysis of the new wafer measurement data comprises detecting drift in the semiconductor manufacturing process.

16. The method of claim 1, wherein the analysis of the new wafer measurement data comprises detecting changes in densities of wafermap pattern groups of the knowledgebase.

17. The method of claim 1, wherein the wafer measurement data comprises measurements from a plurality of wafers from manufacturing phases of different layers of the wafer.

18. The method of claim 1, the method further comprising obtaining wafer measurement data of a known group of wafers with known properties;

fitting Zernike polynomials to the wafer measurement data of the known group of wafers to obtain representation of respective wafermap patterns of the known group of wafers;

including the known group of wafers in the knowledgebase of wafermap patterns by including wafermap patterns of the known group of wafers and the respective coefficients of the Zernike polynomials in the knowledgebase of wafermap patterns.

19. An apparatus comprising a processor, and a memory including computer program code; the memory and the computer program code configured to, with the processor, cause the apparatus to perform the method of claim 1.

20. A non-transitory computer readable medium, having stored thereon a computer program comprising computer executable program code which, when executed by a processor, causes an apparatus to perform the method of claim 1.

* * * * *